(12) United States Patent
Yamada (10) Patent No.: US 6,822,895 B2
(45) Date of Patent: Nov. 23, 2004

(54) MAGNETIC MEMORY DEVICE (75) Inventor: Kouichi Yamada, Gifu (JP)

(73) Assignee: Sanyo Electric Co., Ltd., Oaska (JP)

( * ) Notice: Subject to any disclaimer, the term of this patent is extended or adjusted under 35 U.S.C. 154(b) by 51 days.

(21) Appl. No.: 10/157,119

(22) Filed: May 30, 2002

(65) Prior Publication Data

US 2002/0191437 A1 Dec. 19, 2002

(30) Foreign Application Priority Data

Jun. 6, 2001 (JP) ........................................ 2001-170765

(51) Int. Cl.$^7$ ............................................. G11C 11/00
(52) U.S. Cl. ...................... 365/158; 365/157; 365/171
(58) Field of Search ............................ 365/46, 47, 50, 365/55, 65, 66, 157, 158, 171, 173

(56) References Cited

U.S. PATENT DOCUMENTS

| | | | |
|---|---|---|---|
| 5,051,954 A | * | 9/1991 | Toda et al. ............ 365/189.02 |
| 5,375,082 A | | 12/1994 | Katti et al. |
| 5,946,227 A | | 8/1999 | Naji |
| 6,111,781 A | | 8/2000 | Naji |
| 6,456,523 B1 | * | 9/2002 | Tanaka et al. .............. 365/158 |

FOREIGN PATENT DOCUMENTS

| | | |
|---|---|---|
| EP | 0 613 148 A2 | 8/1994 |
| JP | 8-063962 | 3/1996 |
| JP | 9-293387 | 11/1997 |

OTHER PUBLICATIONS

"Present Circumstances and Future Prospects of MRAM and Competitive Techniques", p. 5, Data of the 116th Meeting of the Magnetic Society of Japan, Nov. 17, 2000.
Nikkei Electronics Nov. 15, 1999 (No. 757) pp. 49–56.

* cited by examiner

*Primary Examiner*—Van Thu Nguyen
(74) *Attorney, Agent, or Firm*—Arent Fox (57) ABSTRACT

A magnetic memory device capable of preventing the structure of an amplifier (sense amplifier) from complication and performing high-speed reading is obtained. This magnetic memory device comprises a memory cell consisting of a storage element exhibiting ferromagnetic resistance and a transistor connected to the storage element, a word line connected to a control terminal of the transistor, a bit line connected to a first end of the storage element through the transistor, a reference bit line connected in common for a plurality of bit liens and an amplifier connected to the bit line and the reference bit line. The magnetic memory device reads potential difference caused between the bit line and the reference bit line with the amplifier in data reading.

19 Claims, 8 Drawing Sheets

MAGNETIC MEMORY DEVICE

BACKGROUND OF THE INVENTION

1. Field of the Invention

The present invention relates to a magnetic memory device, and more specifically, it relates to a magnetic memory device including a storage element exhibiting ferromagnetic tunneling.

2. Description of the Background Art

An MRAM (magnetic random access memory), which is a nonvolatile memory recording data through magnetism is known in general. This MRAM is disclosed in detail in Nikkei Electronics, 1999. 11. 15 (No. 757), pp. 49–56 or the like.

Figure 9:
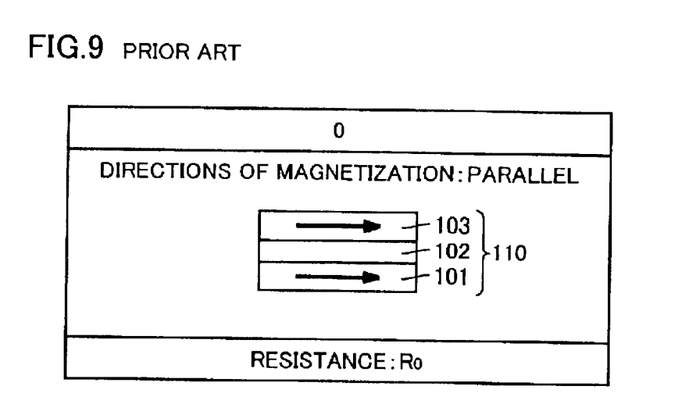
FIGS. 9 and 10 are schematic diagrams for illustrating the structure of a storage element of a conventional MRAM.
Figure 10:
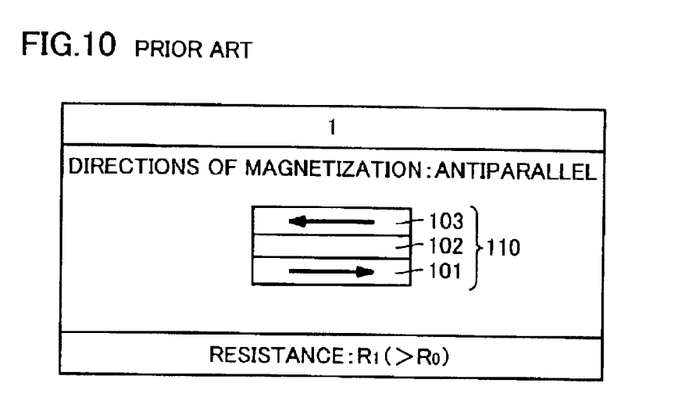

FIGS. 9 and 10 are schematic diagrams for illustrating the structure of a storage element 110 of the MRAM disclosed in the aforementioned literature. Referring to FIG. 9, the storage element 110 of the conventional MRAM comprises a ferromagnetic layer 101, another ferromagnetic layer 103 and a nonmagnetic layer 102 arranged between the ferromagnetic layers 101 and 103.

The ferromagnetic layer 101 is harder to invert than the ferromagnetic layer 103. The term "ferromagnetism" indicates magnetism in a case where magnetic atoms or free atoms of a metal orientate magnetic moments in parallel with each other by positive exchange interaction to form spontaneous magnetization, and a substance exhibiting this ferromagnetism is referred to as a ferromagnetic substance. The ferromagnetic layers 101 and 103 consist of such ferromagnetic substances. In general, a GMR (giant magnetoresistance) film employing a metal is employed as the nonmagnetic layer 102. A TMR (tunneling magnetoresistance) film employing an insulator is recently developed as the nonmagnetic layer 102. This TMR film advantageously has higher resistance than the GMR film. More specifically, the MR ratio (the rate of change of resistance) of the GMR film is in the 10% level, while that of the TMR film is at least 20%. The storage element 110 consisting of the TMR film is hereinafter referred to as a TMR element 110.

The storage principle of the conventional MRAM employing the TMR element 110 is now described with reference to FIGS. 9 and 10. As shown in FIG. 9, the state where the two ferromagnetic layers 101 and 103 are magnetized in the same direction (parallel) is associated with data "0". As shown in FIG. 10, the state where the two ferromagnetic layers 101 and 103 are magnetized in the opposite directions (antiparallel) is associated with data "1". The TMR element 110 exhibits small resistance ($R_0$) when the directions of magnetization are parallel, while exhibiting large resistance ($R_1$) when the directions of magnetization are antiparallel. "0" or "1" is determined through the resistance of the TMR element 110 varying with the parallel or antiparallel directions of magnetization.

Figure 11:
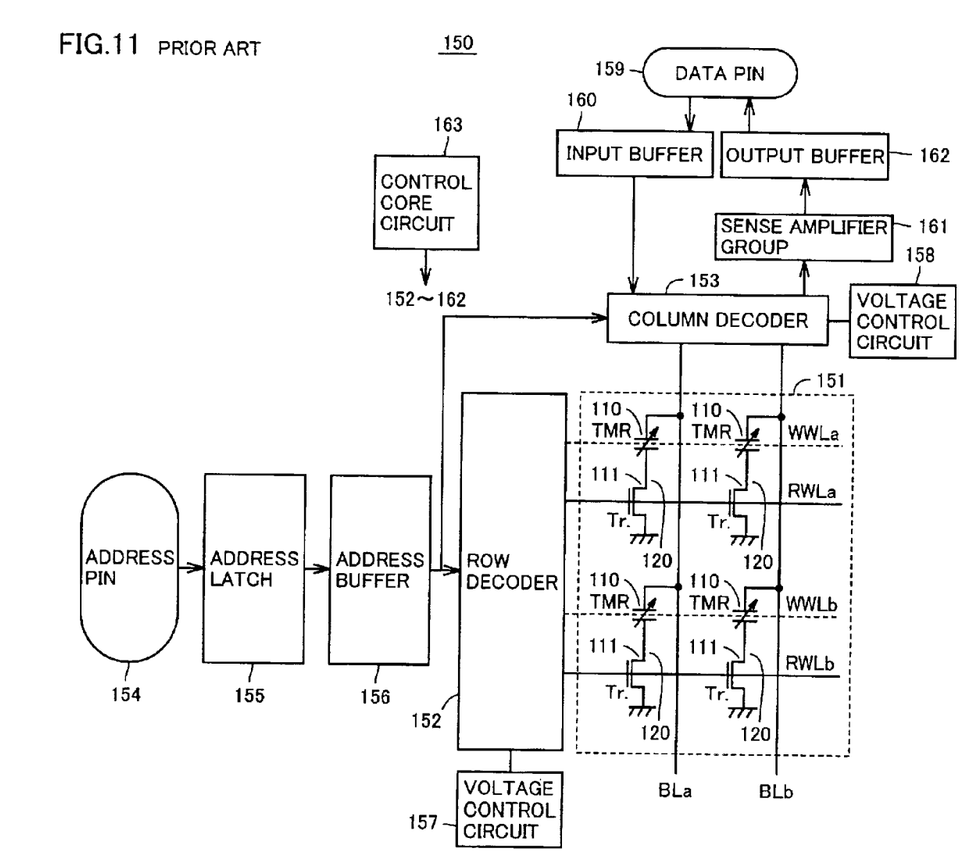
FIG. 11 is a block diagram showing the overall structure of the conventional MRAM.

FIG. 11 is a block diagram showing the overall structure of a conventional MRAM 150 having memory cells each formed by a TMR element and a transistor. The structure of the conventional MRAM 150 is now described with reference to FIG. 11.

A memory cell array 151 is formed by arranging a plurality of memory cells 120 in the form of a matrix (FIG. 11 shows only four memory cells 120 for simplifying the illustration). Each memory cell 120 is formed by a TMR element 110 and an NMOS transistor 111.

In the memory cells 120 arranged in a row direction, the gates of the NMOS transistors 111 are connected to common read word lines $RWL_a$ to $RWL_n$. In the memory cells 120 arranged in the row direction, further, rewrite word lines $WWL_a$ to $WWL_n$ are arranged on first ferromagnetic layers of the TMR elements 110.

In the memory cells 120 arranged in a column direction, first ferromagnetic layers of the TMR elements 110 are connected to common bit lines $BL_a$ to $BL_n$.

The read word lines $RWL_a$ to $RWL_n$ are connected to a row decoder 152, while the bit lines $BL_a$ to $BL_n$ are connected to a column decoder 153.

Externally specified row and column addresses are input in an address pin 154, and transferred from the address pin 154 to an address latch 155. In the addresses latched by the address latch 155, the row address is transferred to the row decoder 152 through an address buffer 156, and the column address is transferred to the column decoder 153 through the address buffer 156.

The row decoder 152 selects a read word line RWL corresponding to the row address latched by the address latch 155 from the read word lines $RWL_a$ to $RWL_n$, while selecting a rewrite word line WWL corresponding to the row address latched by the address latch 155 from the rewrite word lines $WWL_a$ to $WWL_n$. The row decoder 152 further controls the potentials of the read word lines $RWL_a$ to $RWL_n$ and the potentials of the rewrite word lines $WWL_a$ to $WWL_n$ on the basis of a signal from a voltage control circuit 157.

The column decoder 153 selects a bit line BL corresponding to the column address latched by the address latch 155 from the bit lines $BL_a$ to $BL_n$, while controlling the potentials of the bit lines $BL_a$ to $BL_n$ on the basis of a signal from another voltage control circuit 158.

Externally specified data is input in a data pin 159 and transferred from the data pin 159 to the column decoder 153 through an input buffer 160. The column decoder 153 controls the potentials of the bit lines $BL_a$ to $BL_n$ in correspondence to the data.

Data read from an arbitrary memory cell 120 is transferred from any of the bit lines $BL_a$ to $BL_n$ to a sense amplifier group 161 through the column decoder 153. The sense amplifier group 161 is formed by current sense amplifiers. The data determined by the sense amplifier group 161 is output from an output buffer 162 through the data pin 159.

A control core circuit 163 controls operations of the aforementioned circuits 152 to 162.

Write (rewrite) and read operations of the conventional MRAM 150 having the aforementioned structure are now described.

Write Operation

In the write operation, orthogonal currents are fed to the selected rewrite word line WWL and the selected bit line BL. Thus, data can be rewritten only in the TMR element 110 located on the intersection between the bit line BL and the rewrite word line WWL. More specifically, the currents flowing through the rewrite word line WWL and the bit line BL generate magnetic fields, and the sum (combined magnetic field) of the two magnetic fields acts on the TMR element 110. This combined magnetic field inverts the directions of magnetization of the TMR element 110 from "1" to "0", for example.

The TMR elements 110 located on positions other than the aforementioned intersection include those fed with no currents and those only unidirectionally fed with currents. In each TMR element 110 fed with no current, no magnetic field is generated and hence the directions of magnetization remain unchanged. In each TMR element 110 only unidirectionally fed with a current, a magnetic field is generated in a magnitude insufficient for inverting the directions of magnetization. Therefore, the directions of magnetization remain unchanged in the TMR element 110 only unidirectionally fed with a current.

As hereinabove described, the directions of magnetization of the TMR element 110 located on the interposition between the selected bit line BL and the selected rewrite word line WWL can be changed as shown in FIG. 9 or 10 by feeding currents to the bit line BL and the rewrite word line WWL corresponding to the selected address. Thus, the data "0" or "1" can be written.

Read Operation

In order to read the data written in the aforementioned manner, a voltage is applied to the read word line RWL for rendering the NMOS transistor 111 conductive. In this state, determination is made as to whether or not the value of a current flowing through the bit line BL is larger than a reference current value, thereby determining "1" or "0".

In this case, the directions of magnetization are parallel in the case of the data "0" shown in FIG. 9, and hence the resistance value ($R_0$) is small. Therefore, the value of the current flowing through the bit line BL is larger than the reference current value. In the case of the data "1" shown in FIG. 10, on the other hand, the directions of magnetization are antiparallel and hence the resistance value ($R_1$) is larger than that shown in FIG. 9. Therefore, the value of the current flowing through the bit line BL is smaller than the reference current value.

In the aforementioned conventional MRAM 150, the potential of the bit line BL must be set to a small level of not more than 0.4 V for detecting the current value in data reading. This is because resistance change of the TMR element 110 cannot be confirmed unless potential difference across the TMR element 110 is small. Therefore, the potential difference across the TMR element 110 must be small (not more than 0.4 V), leading to a small current value. The structure of the sense amplifier (amplifier) is disadvantageously complicated in order to detect such a small current value. Further, the reading speed is reduced when detecting the small current value.

SUMMARY OF THE INVENTION

An object of the present invention is to provide a magnetic memory device having a sense amplifier (amplifier) not complicated in structure.

Another object of the present invention is to provide a magnetic memory device capable of improving the reading speed as compared with a case of detecting a small current value for determining data.

A magnetic memory device according to an aspect of the present invention comprises a memory cell consisting of a storage element exhibiting ferromagnetic resistance and a transistor connected to the storage element, a word line connected to a control terminal of the transistor, a bit line connected to a first end of the storage element through the transistor, a reference bit line provided in common for a plurality of bit lines and an amplifier connected to the bit line and the reference bit line, for reading potential difference caused between the bit line and the reference bit line with the amplifier in data reading.

In the magnetic memory device according to this aspect, the memory cell is formed by a storage element exhibiting ferromagnetic resistance and a transistor while the amplifier detects the potential difference between the bit line connected to the storage element and the reference bit line as hereinabove described, whereby data can be readily read. Thus, no value of a small current flowing through the bit line may be detected dissimilarly to the prior art, whereby the structure of the amplifier is not complicated. The amplifier reads the potential difference caused between the bit line and the reference bit line, whereby data can be readily detected also when the storage element has high resistance dissimilarly to the prior art reading the value of the small current flowing through the bit line.

The magnetic memory device according to this aspect is so structured as to detect the potential difference between the bit line and the reference bit line with the amplifier as hereinabove described, whereby data stored in the magnetic memory device can be read through a simple amplifier similar to an amplifier (sense amplifier) employed for a conventional DRAM. Thus, no sense amplifier having a complicated structure may be employed dissimilarly to the prior art, whereby high-speed reading is enabled.

The magnetic memory device according to the aforementioned aspect preferably further comprises an auxiliary word line connected to a second end of the storage element for pulling down the potential on the second end of the storage element to a ground potential in response to rise timing of a signal toward the word line, for reading the potential difference caused between the bit line and the reference bit line at transient timing for lowering the potential of the auxiliary word line to the ground potential. According to this structure, the auxiliary word line can readily pull down the potential of the storage element toward the ground potential. The potential difference caused between the bit line and the reference bit line is read with the amplifier at the transient timing for lowering the potential of the auxiliary word line to the ground potential, whereby stored data can be readily detected.

In this case, the transient timing for lowering the potential of the auxiliary word line to the ground potential is preferably before the potential of the bit line and the potential of the reference bit line reach the ground potential. According to this structure, the potential difference between the bit line and the reference bit line can be prevented from disappearing. If the potential of the auxiliary word line reaches the ground potential, the potentials of the bit line and the reference bit line also reach the ground potential immediately thereafter, to exhibit no potential difference. When the amplifier detects the potential difference between the bit line and the reference bit line before the potentials of the bit line and the reference bit line reach the ground potential, therefore, the amplifier can detect the potential difference between the bit line and the reference bit line before the same disappears.

In the magnetic memory device according to the aforementioned aspect, the amplifier is preferably provided in common for a plurality of bit lines. According to this structure, the circuit structure can be simplified as compared with a case of providing the amplifier every bit line.

In the magnetic memory device according to the aforementioned aspect, the storage element exhibiting ferromagnetic resistance preferably includes a first magnetic layer and a second magnetic layer, arranged oppositely to the first magnetic layer through an insulating barrier layer, harder to invert than the first magnetic layer. According to this structure, data can be readily stored by setting the directions of magnetization of the first and second magnetic layers parallel or antiparallel in response to the data.

In the magnetic memory device according to the aforementioned aspect, the reference bit line preferably includes a reference memory cell provided every word line, and the reference memory cell preferably includes a first resistive element and a transistor connected to the first resistive element. According to this structure, the potential difference between the bit line including the memory cell and the reference bit line including the reference memory cell can be readily detected.

In this case, the first resistive element of the reference memory cell preferably has an intermediate resistance value between a resistance value attained when the directions of magnetization of the storage element are parallel and a resistance value attained when the directions of magnetization of the storage element are antiparallel. According to this structure, potential difference can be caused between the bit line and the reference bit line.

In this case, further, the first resistive element of the reference memory cell preferably includes two second resistive elements, exhibiting ferromagnetic resistance, having the resistance value attained when the directions of magnetization of the storage element are parallel and two third resistive elements, exhibiting ferromagnetic resistance, having the resistance value attained when the directions of magnetization of the storage element are antiparallel, and the second resistive elements and the third resistive elements are preferably serially connected respectively while pairs of the serially connected second resistive elements and third resistive elements are connected in parallel with each other. According to this structure, the resistance of the first resistive element of the reference memory cell connected to the reference bit line can be set to a value half the sum of the resistance value attained when the directions of magnetization of the storage element are parallel and that attained when the directions of magnetization of the storage element are antiparallel. Thus, potential difference can be readily caused between the bit line and the reference bit line. In this case, the storage element of the memory cell may include a TMR element, and the second resistive elements and the third resistive elements of the reference memory cell may include TMR elements.

In the aforementioned case, the first resistive element of the reference memory cell may include a second resistive element, exhibiting ferromagnetic resistance, having a resistance value substantially half the resistance value attained when the directions of magnetization of the storage element are parallel and a third resistive element, exhibiting ferromagnetic resistance, having a resistance value substantially half the resistance value attained when the directions of magnetization of the storage element are antiparallel, and the second resistive element and the third resistive element may be serially connected with each other. According to this structure, the resistance of the first resistive element of the reference memory cell connected to the reference bit line can be set to a value half the sum of the resistance value attained when the directions of magnetization of the storage element connected to the bit line are parallel and that attained when the directions of magnetization of the storage element are antiparallel. Thus, potential difference can be readily caused between the bit line and the reference bit line.

In this case, the storage element of the memory cell may include a TMR element, and the second resistive element and the third resistive element of the reference memory cell may include TMR elements. In this case, further, the second resistive element and the third resistive element of the reference memory cell may have areas twice that of the storage element of the memory cell.

In the aforementioned case, the first resistive element of the reference memory cell may have a resistance value substantially identical to either the resistance value attained when the directions of magnetization of the storage element are parallel or the resistance value attained when the directions of magnetization of the storage element are antiparallel. In this case, the load capacity of the bit line and the load capacity of the reference bit line may be different from each other. According to this structure, potential difference is caused between the bit line and the reference bit line also when the resistance value of the first resistive element is substantially identical to either the resistance value attained when the directions of magnetization of the storage element are parallel or that attained when the directions of magnetization of the storage element are antiparallel, whereby data can be readily determined. In this case, the gate widths of a pair of transistors forming the amplifier may be different from each other.

In this case, further, the first resistive element of the reference memory cell may have a resistance value substantially identical to the resistance value attained when the directions of magnetization of the storage element are parallel. Alternatively, the first resistive element of the reference memory cell may have a resistance value substantially identical to the resistance value attained when the directions of magnetization of the storage element are antiparallel.

In the magnetic memory device according to the aforementioned aspect, the storage element of the memory cell may include a TMR element. Further, the amplifier may include a cross-coupled latch type voltage sense amplifier.

The magnetic memory device according to the aforementioned aspect preferably further comprises a dummy bit line provided in common for a plurality of bit lines and a comparator connected to the dummy bit line through the transistor, and a dummy storage element having two magnetic layers so set that the directions of magnetization are parallel to each other is preferably connected to the dummy bit line. According to this structure, potential difference caused between the bit line and the reference bit line can be readily sensed through the dummy bit line and the comparator.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
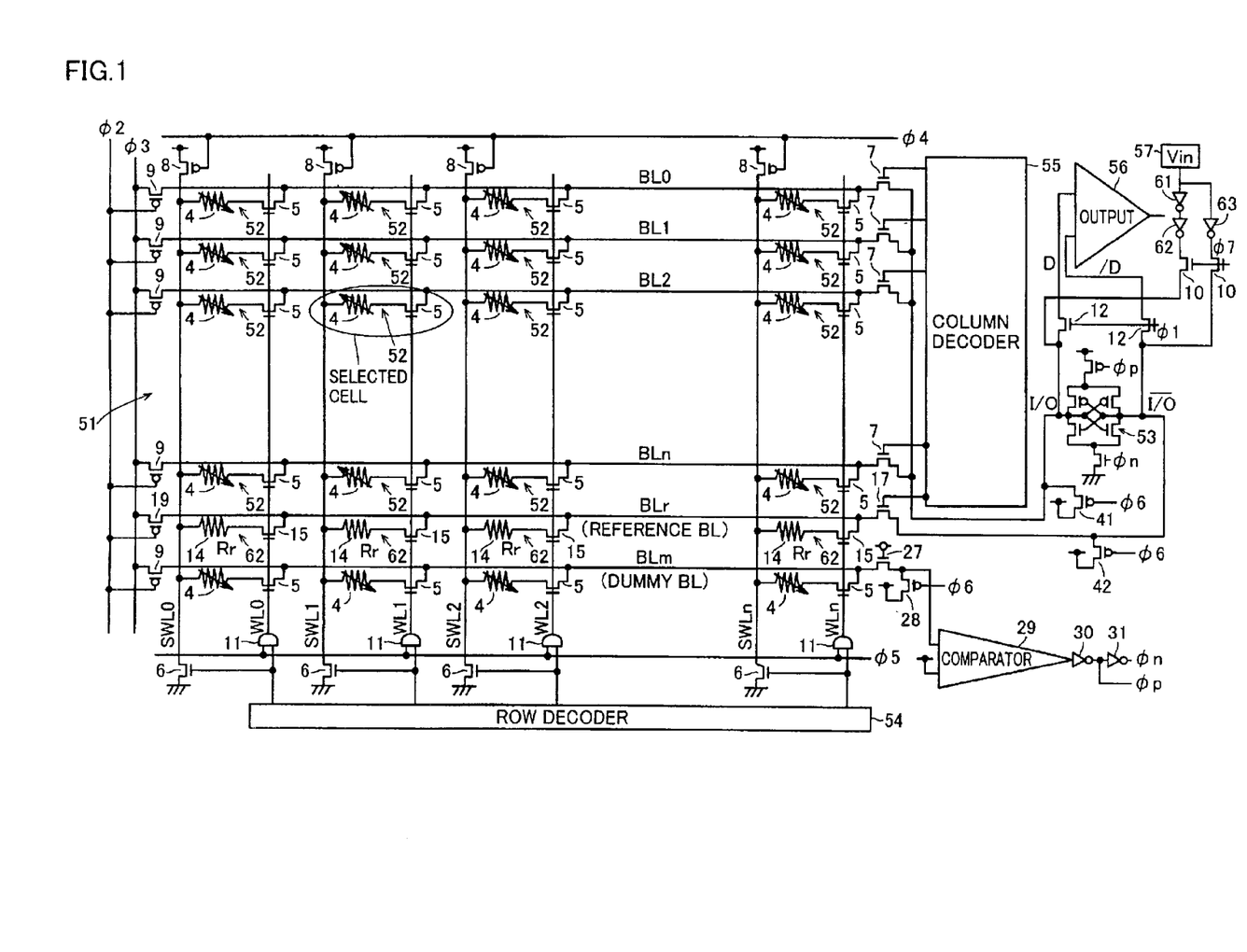
FIG. 1 is a block diagram showing the overall structure of an MRAM according to a first embodiment of the present invention.
Figure 2:
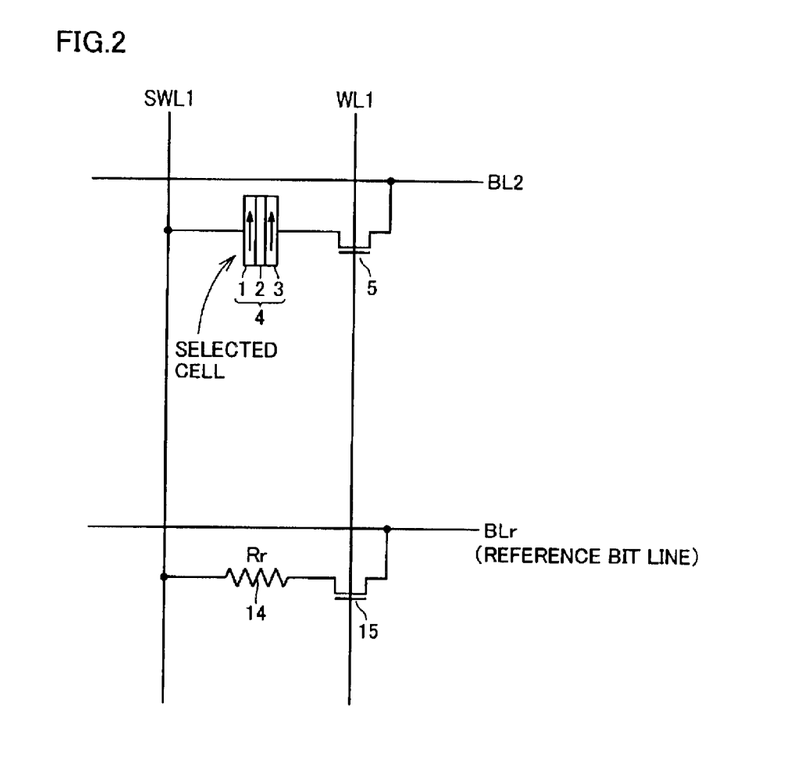
FIG. 2 is a circuit diagram showing the structures of a bit line and a reference bit line of the MRAM according to the first embodiment shown in FIG. 1.

The overall structure of an MRAM according to a first embodiment of the present invention is described with reference to FIGS. 1 and 2. The MRAM according to the first embodiment is mainly structured by a memory cell array 51 provided in the form of a matrix. The memory cell array 51 is formed by memory cells 52 arranged in row and column directions. Each memory cell 52 stores 1-bit data forming the minimum unit of storage.

In the MRAM according to the first embodiment, each memory cell 52 is formed by a TMR element 4 and an NMOS transistor 5. As shown in FIG. 2, the TMR element 4 includes a ferromagnetic layer 3, an insulating barrier layer 2 and another ferromagnetic layer 1 harder to invert than the ferromagnetic layer 3. A word line WL is connected to the gate of each NMOS transistor 5.

The TMR element 4 is an example of the "storage element exhibiting ferromagnetic resistance" according to the present invention. The ferromagnetic layer 3 is an example of the "first magnetic layer" according to the present invention, and the ferromagnetic layer 1 is an example of the "second magnetic layer" according to the present invention. The NMOS transistor 5 is an example of the "transistor" according to the present invention. The gate of the NMOS transistor 5 is an example of the "control terminal" according to the present invention.

In the memory cell array 51, the memory cells 52 arranged in the row direction (transverse direction in FIG. 1) are connected to the word lines WL and auxiliary word lines SWL. The memory cells 52 arranged in the column direction (vertical direction in FIG. 1) are connected to bit lines BL. A common reference bit line BLr is provided for the plurality of bit lines BL.

A common cross-coupled latch type sense amplifier (SA) 53 is connected to the bit lines BL and the reference bit line BLr. The sense amplifier 53 is an example of the "amplifier" according to the present invention.

The reference bit line BLr includes a reference memory cell 62 consisting of a resistive element 14 and an NMOS transistor 15 every word line WL. The resistive element 14 is an example of the "first resistive element" according to the present invention. The resistive element 14 of the reference memory cell 62 has an intermediate resistance value Rr between the resistance value of the TMR element 4 attained when the directions of magnetization are parallel and that of the TMR element 4 attained when the directions of magnetization are antiparallel.

The word lines WL are connected to a row decider 54. A row address buffer (not shown) supplies an externally specified row address RA to the row decoder 54. Thus, the row decoder 54 selects a word line WL corresponding to the row address RA.

The word lines WL are connected to first input terminals and output terminals of AND circuits 11. A signal line Φ5 regularly going low (0) in writing is connected to second input terminals of the AND circuits 11.

First ends of the auxiliary word lines SWL are grounded through NMOS transistors 6. The gates of the NMOS transistors 6 are connected to the first input terminals of the AND circuits 11. Second ends of the auxiliary word lines SWL are connected to a power supply potential Vcc through PMOS transistors 8. A signal line Φ4 is connected to the gates of the PMOS transistors 8.

A signal line Φ3 is connected to first ends of the bit lines BL and the reference bit line BLr through PMOS transistors 9 and 19 respectively. A signal line Φ2 is connected to the gates of the NMOS transistors 9 and 19.

The bit lines BL and the reference bit line BLr are connected to input/output lines I/O and /I/O through transfer gates (NMOS transistors) 7 and 17 respectively. The input/output lines I/O and /I/O form a pair of input/output lines I/O and /I/O. The input/output lines I/O and /I/O are connected to the sense amplifier 53. An output circuit 56 outputs data.

The MRAM according to the first embodiment is also provided with a dummy bit line BLm (dummy BL) similar in structure to the bit lines BL. The TMR elements 4 are connected to the dummy bit line BLm through the NMOS transistors 5. Every TMR element 4 connected to the dummy bit line BLm is so set that the directions of magnetization of the two ferromagnetic layers 1 and 3 are identical (parallel) to each other. The dummy bit line BLm is connected to a first input end of a comparator 29 through an NMOS transistor 27.

The power supply potential Vcc is connected to the gate of the NMOS transistor 27. A reference voltage Vcc is connected to a second input end of the comparator 29. An inverter 30 is connected to an output of the comparator 29, and another inverter 31 is connected to an output of the inverter 30. The output of the inverter 30 is employed as a signal Φp, while that of the inverter 31 is employed as a signal Φn. These signals Φp and Φn are employed as activation signals for the sense amplifier 53.

The comparator 29 outputs a low-level signal when an input voltage is identical to the reference voltage Vcc, while outputting a high-level signal when the input voltage is reduced below the reference voltage Vcc.

The power supply potential Vcc is connected to the first input terminal of the comparator 29 and the input/output lines I/O and /I/O through PMOS transistors 28, 41 and 42 respectively. A signal line Φ6 is connected to the gates of the PMOS transistors 28, 41 and 42. When the signal line Φ6 is activated, therefore, the potentials of the first input terminal of the comparator 29 and the input/output lines I/O and /I/O are pulled up to the power supply potential Vcc.

An input/output node of the sense amplifier 53 is connected to the output circuit 56 through an NMOS transistor 12. A signal line Φ1 is connected to the gate of the NMOS transistor 12. The input/output node of the sense amplifier 53 is also connected to an input circuit 57 through an NMOS transistor 10. A signal line Φ7 is connected to the gate of the NMOS transistor 10. Inverters 61, 62 and 63 are connected between the input circuit 57 and the NMOS transistor 10.

The gates of the transfer gates 7 and 17 are connected to a column decoder 55. A column address buffer (not shown) supplies an externally specified column address CA to the column decoder 55. The column decoder 55 selects a column (a bit line BL and the reference bit line BLr) of the memory cell array 51 corresponding to the externally specified column address CA.

Write and read operations of the MRAM according to the first embodiment having the aforementioned structure are now described.

Write Operation

An operation for writing data in a memory cell 52 connected to a word line WL1 and a bit line BL2 is now described. In order to write data in the MRAM according to the first embodiment, the potential of the signal line Φ3 is set to ½ Vcc. The transfer gate 7 of the bit line BL2 selected by the column decoder 55 is turned on while the signal line Φ7 is activated thereby supplying a high-level potential (Vcc) from the input/output circuit 57 to the selected bit line BL2 through the input/output line I/O. At this time, the signal Φ2 is set to a low-level potential thereby turning on the PMOS transistor 9, so that the potential on the left end of the selected bit line BL2 reaches ½ Vcc. In this case, the potential on the right end of the selected bit line BL2 is at the level Vcc, whereby a current flows through the bit line BL2 leftward, to generate a magnetic field.

The signal line Φ5 is regularly at a low level and hence the potential of the word line WL1, selected by the row decoder 54, connected to the output terminal of the AND circuit 11 remains low. On the other hand, the gate of the NMOS transistor 6 goes high due to the selection of the word line WL1, thereby turning on the NMOS transistor 6. Thus, the lower end of an auxiliary word line SWL1 corresponding to the selected word line WL1 is going to reach a ground potential Vss. The potential of the signal line Φ4 is set low, so that the upper end of the auxiliary word line SWL1 is going to reach the power supply potential Vcc. Thus, a current flows through the auxiliary word line SWL1 downward, to generate a magnetic field.

As hereinabove described, magnetic fields can be generated in the auxiliary word line SWL1 and the bit line BL2 by feeding a current to the auxiliary word line SWL1 downward while feeding a current to the bit line BL2 leftward in the selected memory cell 52. Thus, data (e.g., "1") can be readily written in the ferromagnetic layer 3 of the TMR element 4 of the selected memory cell 52 located on the intersection between the auxiliary word line SWL1 and the bit line BL2.

In order to write data (e.g., "0") inverse to the aforementioned data in the ferromagnetic layer 3 of the TMR element 4, the direction of the current fed to the bit line BL2 may be opposed. In the non-selected memory cells 52, no currents flow through the auxiliary word lines SWL and hence data are not rewritten in the non-selected memory cells 52.

Read Operation

Figure 3:
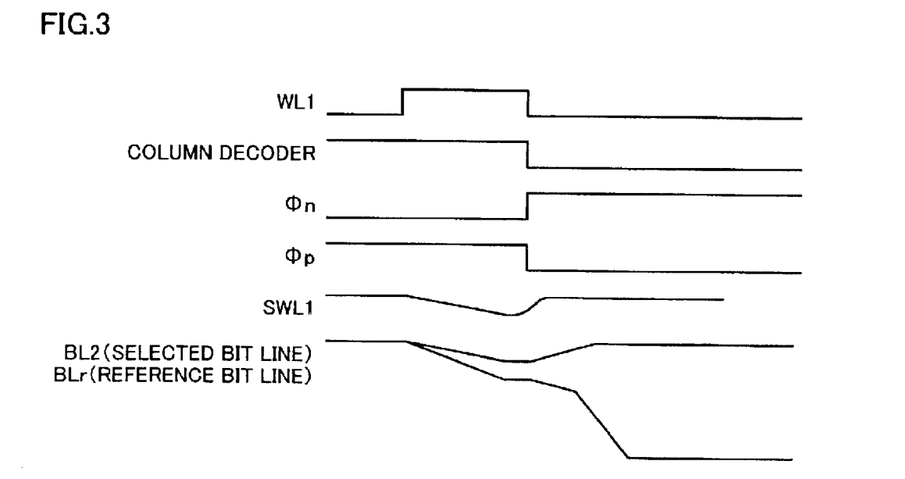
FIG. 3 is an operation waveform diagram for illustrating a read operation of the MRAM according to the first embodiment shown in FIG. 1.

An operation of reading data from the selected memory cell 52 connected to the word line WL1 and the bit line BL2 is now described with reference to FIGS. 1 to 3.

In an initial state, the potentials of the signal lines Φ3 and Φ6 are at the high level Vcc, while the potentials of the signal lines Φ2, Φ4 and Φ5 are at the low level Vss. Therefore, the potentials of each bit line BL, each auxiliary word line SWL, the input/output lines I/O and /I/O and the first terminal of the comparator 29 are at the high level Vcc.

Thereafter the potentials of the signal lines Φ2 and Φ4 reach the high level Vcc through an activation signal, while each bit line BL and each auxiliary word line SWL enter floating states of the power supply potential Vcc. Thereafter an address is input in the row decoder 54 while the signal line Φ5 is activated to a high level so that the output of the AND circuit 11 goes high, whereby the potential of the selected word line WL1 rises to a high level. The potential of the selected word line WL1, input in the AND circuit 11, goes high thereby turning on the NMOS transistor 6 connected to the auxiliary word line SWL1 corresponding to the selected word line WL1. Thus, the potential of the auxiliary word line SWL1 brought into the floating state of the power supply potential Vc starts to gradually lower from the power supply potential Vcc to the ground potential Vss.

At this time, the bit line BL2 and the reference bit line BLr are connected to the input/output lines I/O and /I/O due to the address input in the column decoder 55. When the potential of the auxiliary word lie SWL1 starts to lower from the power supply potential Vcc toward the ground potential Vss in this state, the potentials of the bit line BL and the reference bit line BLr also start to lower from the power supply potential Vcc to the ground potential Vcc. Thus, the potentials of the input/output lines I/O and /I/O input in the sense amplifier 53 also start to lower from the power supply potential Vcc toward the ground potential Vss. In this case, the TMR element 4 of the selected memory cell 52, having parallel directions of magnetization as shown in FIG. 2, has a smaller resistance value than the resistive element 14 of the reference bit line BLr. Therefore, the potentials of the input/output lines I/O and /I/O connected with the bit line BL2 and the reference bit line BLr respectively lower from the power supply potential Vcc to the ground potential Vss at different speeds. More specifically, the potential of the input/output line I/O is going to fall quicker than that of the input/output line /I/O, leading to potential difference between the input/output lines I/O and /I/O.

The dummy bit line BLm and the comparator 29 sense this potential difference. The TMR element 4 connected to the dummy bit line BLm is set in the low-resistance state with the parallel directions of magnetization, and hence the potential of the dummy bit line BLm starts to lower at the same timing as that of either the bit line BL2 or the reference bit line BLr (the bit line BL2 in the first embodiment) having lower resistance. The signals Φp and Φn are activated due to the sensing by the dummy bit line BLm and the comparator 29, thereby activating the sense amplifier 53. The activated sense amplifier 53 is employed for amplifying the potential difference between the input/output lines I/O and /I/O, so that the potential of the input/output line I/O goes low and the potential of the input/output line /I/O goes high.

In this state, the potential of the signal line Φ1 is set to a high level thereby turning on the NMOS transistor 12. Thus, the low and high levels of the input/output lines I/O and /I/O are transferred to data lines D and /D respectively. The output circuit 56 outputs a signal corresponding thereto.

Thereafter the potential of the signal line Φ3 is set to the high level Vcc while setting the signal lines Φ2, Φ3 and Φ5 to the ground potential Vss, thereby precharging the bit lines BL and the auxiliary word lines SWL to the power supply potential Vcc for preparing for subsequent reading.

When the selected memory cell 52 stores data with antiparallel directions of magnetization, the resistive element 14 connected to the reference bit line BLr exhibits a smaller resistance value and hence the potential of the input/output line /I/O starts to fall quicker than that of the input/output line I/O contrarily to the above. When the sense amplifier 53 amplifies this potential difference, the potentials of the input/output lines I/O and /I/O go high and low respectively. A subsequent operation is carried out similarly to the above, for preparing for a subsequent address.

The sense amplifier 53 detects the potential difference between the input/output lines I/O and /I/O at timing before the potentials of the bit line BL2 and the reference bit line BLr reach the ground potential GND. If the potentials of the bit line BL2 and the reference bit line BLr are quickly pulled down to the ground potential GND, the potential difference between the auxiliary word line SWL and the bit line BL2 and the reference bit line BLr is so excessively increased that the MR ratio (the rate of change of resistance) disappears. Consequently, the potentials of the bit line BL2 and the reference bit line BLr reach the ground potential GND at the same speed. In this case, the potential difference between the bit line BL2 and the reference bit line BLr disappears to allow no detection of potential difference.

While potential difference is caused between the bit line BL2 and the reference bit line BLr at transient timing, the TMR element 4 and the resistive element 14 are conductors and hence the bit line BL2 and the reference bit line BLr finally reach the same potential.

According to the first embodiment, as hereinabove described, each memory cell 52 is formed by the single TMR element 4 and the single NMOS transistor 5 while the sense amplifier 53 detects the potential difference between the bit line BL connected to the TMR element 4 and the reference bit line BLr, whereby data can be readily read. Thus, the potential difference is so detected that no value of a small current flowing through the bit line may be detected dissimilarly to the prior art. Consequently, the MRAM can be prevented from such inconvenience that the structure of the sense amplifier 53 is complicated for detecting the value of a small current.

According to the first embodiment, further, the sense amplifier 53 detects the potential difference between the bit line BL and the reference bit line BLr as described above, whereby data stored in the MRAM can be read through the simple sense amplifier 53 similar to that employed for a conventional DRAM. Thus, the data can be read through the simple sense amplifier 53, whereby the read operation can be performed at a higher speed as compared with a conventional structure employing a sense amplifier having a complicated structure.

According to the first embodiment, in addition, the MRAM is provided with the sense amplifier 53 common for the respective bit lines BL, whereby the circuit structure can be simplified as compared with a case of providing such a sense amplifier 53 every bit line BL.

Second Embodiment

Figure 4:
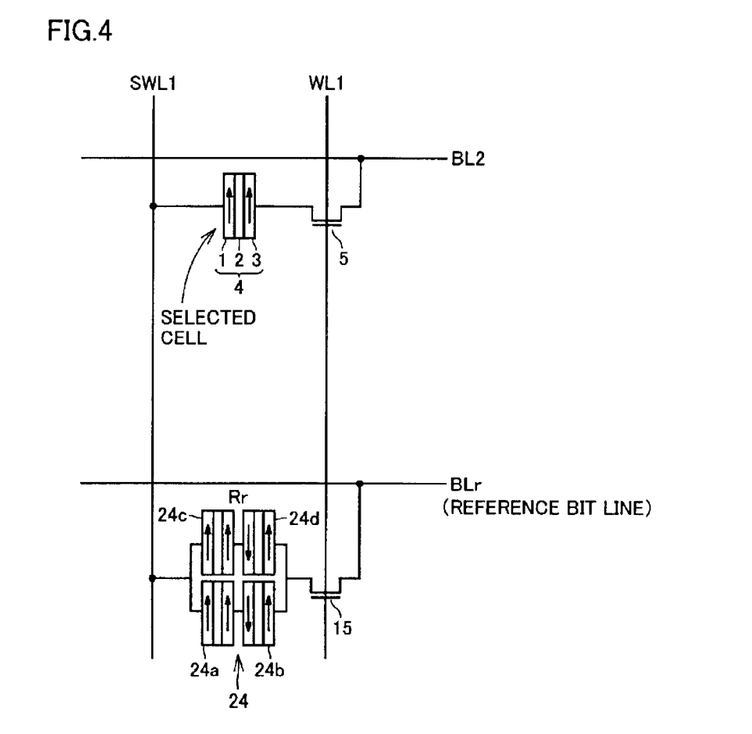
FIG. 4 is a circuit diagram showing the structures of a bit lie and a reference bit line of an MRAM according to a second embodiment of the present invention.
Figure 5:
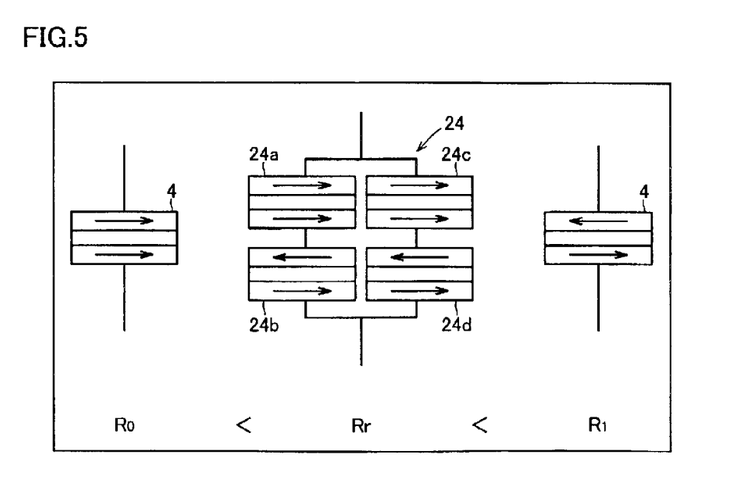
FIG. 5 is a schematic diagram for illustrating resistance values of a resistive element connected to the reference bit line of the MRAM according to the second embodiment shown in FIG. 4.

In an MRAM according to a second embodiment of the present invention, a resistive element 24 connected to a reference bit line BLr is formed by two TMR elements 24a and 24c having parallel directions of magnetization and two TMR elements 24b and 24d having antiparallel directions of magnetization as shown in FIGS. 4 and 5, dissimilarly to the aforementioned first embodiment. The TMR elements 24a and 24b are serially connected with each other, while the TMR elements 24c and 24d are serially connected with each other. The serially connected TMR elements 24a and 24b and the serially connected TMR elements 24c and 24d are connected in parallel with each other.

According to the second embodiment, the resistive element 24 is formed by the four TMR elements 24a to 24d, whereby a resistance value Rr of the resistive element 24 can be set to an intermediate level between a resistance value $R_0$ of the TMR element 4 attained when the directions of magnetization are parallel and a resistance value $R_1$ of the TMR element 4 attained when the directions of magnetization are antiparallel, i.e., half the sum of the resistance values $R_0$ and $R_1$.

The resistive element 4 is an example of the "first resistive element" according to the present invention. The TMR elements 24a and 24c are examples of the "second resistive element" according to the present invention, and the TMR elements 24b and 24d are examples of the "third resistive element" according to the present invention.

The MRAM according to the second embodiment is similar in structure, effect, write operation and read operation to the MRAM according to the first embodiment except the aforementioned points.

Third Embodiment

Figure 6:
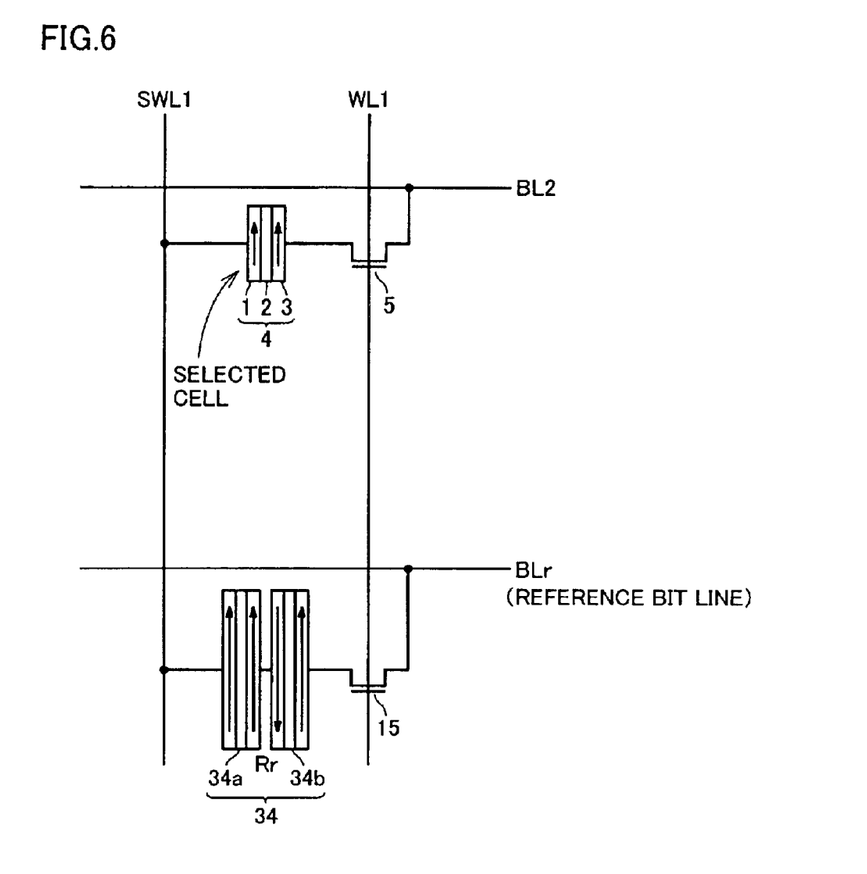
FIG. 6 is a circuit diagram showing the structures of a bit lie and a reference bit line of an MRAM according to a third embodiment of the present invention.

In an MRAM according to a third embodiment of the present invention, a resistive element 34 connected to a reference bit line BLr is formed by a TMR element 34a having parallel directions of magnetization and another TMR element 34b having antiparallel directions of magnetization as shown in FIG. 6, dissimilarly to the aforementioned second embodiment. The TMR elements 34a and 34b are serially connected with each other.

According to the third embodiment, each of the TMR elements 34a and 34b is formed to have an area twice the area of a TMR element 4 forming a memory cell. Thus, the resistance value of the resistive element 34 can be set to an intermediate level between a resistance value $R_0$ of the TMR element 4 attained when the directions of magnetization are parallel and a resistance value $R_1$ of the TMR element 4 attained when the directions of magnetization are antiparallel, i.e., half the sum of the resistance values R0 and $R_1$, similarly to the second embodiment.

The resistive element 34 is an example of the "first resistive element" according to the present invention. The TMR element 34a is an example of the "second resistive element" according to the present invention, and the TMR element 34b is an example of the "third resistive element" according to the present invention.

The MRAM according to the third embodiment is similar in structure, effect, write operation and read operation to the MRAM according to the first embodiment except the aforementioned points.

Fourth Embodiment

Figure 7:
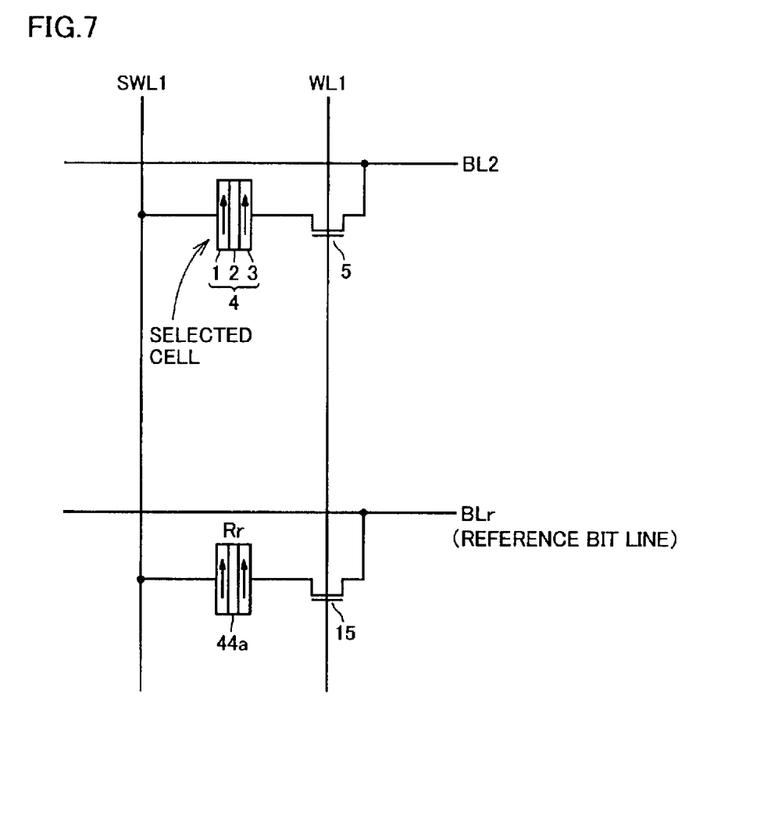
FIG. 7 is a circuit diagram showing the structures of a bit lie and a reference bit line of an MRAM according to a fourth embodiment of the present invention.

In an MRAM according to a fourth embodiment of the present invention, a resistive element 44a connected to a reference bit line BLr is formed by a TMR element having parallel directions of magnetization as shown in FIG. 7, dissimilarly to the aforementioned second and third embodiments. The resistive element 44a is an example of the "first resistive element" according to the present invention.

In other words, a resistance value Rr of the resistive element 44a connected to the reference bit line BLr is set identical to the resistance value of a TMR element 4, having parallel directions of magnetization, forming a memory cell. Thus, the resistance value Rr of the resistive element 44a is identical to the resistance value of the TMR element 4 of a selected cell connected to a selected bit line BL2. When the load capacity of the bit line BL2 is rendered different from the load capacity of the reference bit line BLr in this case, for example, potential difference is caused between the bit line BL2 and the reference bit line BLr also when the resistance value Rr of the resistive element 44a is identical to the resistance value of the TMR element 4, whereby a sense amplifier 53 can readily determine data.

Data can also be readily determined by rendering gate widths of transistors forming the sense amplifier 53 different from each other without rendering the load capacities of the bit line BL2 and the reference bit line BLr different from each other.

When selecting another memory cell including a TMR element 4 having antiparallel directions of magnetization, the resistance value Rr of the resistive element 44a is smaller than the resistance value of the TMR element 4 of the selected memory cell, and hence data can be readily determined.

The MRAM according to the fourth embodiment is similar in structure, effect, write operation and read operation to the MRAM according to the first embodiment except the aforementioned points.

Fifth Embodiment

Figure 8:
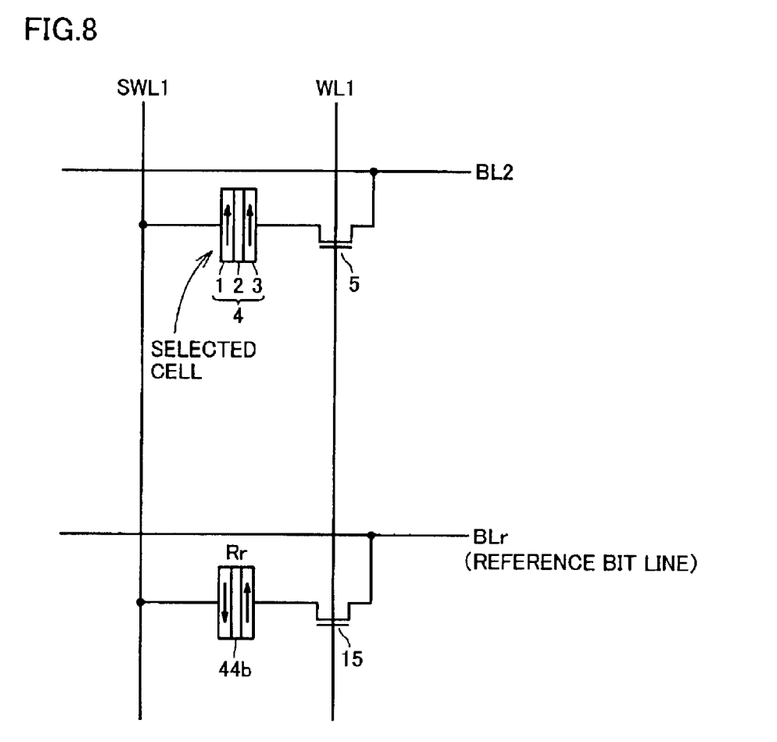
FIG. 8 is a circuit diagram showing the structures of a bit lie and a reference bit line of an MRAM according to a fifth embodiment of the present invention.

In an MRAM according to a fifth embodiment of the present invention, a resistive element 44b connected to a reference bit line BLr is formed by a TMR element having antiparallel directions of magnetization as shown in FIG. 8, dissimilarly to the aforementioned fourth embodiment. The resistive element 44b is an example of the "first resistive element" according to the present invention.

In other words, a resistance value Rr of the resistive element 44b is set to the same value as the resistance value of a TMR element 4 having antiparallel directions of magnetization. Thus, the resistance value Rr of the resistive element 44b exceeds the resistance value of the TMR element 4 of a selected cell connected to a selected bit line BL2. In this case, a sense amplifier 53 can readily determine data.

When selecting another memory cell including a TMR element 4 having antiparallel directions of magnetization, the resistance value Rr of the resistive element 44b is identical to the resistance value of the TMR element 4 of the selected memory cell. Also in this case, the potentials of the bit line BL2 and the reference bit line BLr lower at different speeds also when the resistance value Rr of the resistive element 44b is identical to the resistance value of the TMR element 4 if the load capacities of the bit line BL2 and the reference bit line BLr are rendered different from each other, for example, similarly to the aforementioned fourth embodiment, whereby potential difference is caused between the bit line BL2 and the reference bit line BLr. Thus, the sense amplifier 53 can readily determine the data.

Data can also be readily determined by rendering gate widths of transistors forming the sense amplifier 53 different from each other without rendering the load capacities of the bit line BL2 and the reference bit line BLr different from each other.

The MRAM according to the fifth embodiment is similar in structure, effect, write operation and read operation to the MRAM according to the first embodiment except the aforementioned points.

Although the present invention has been described and illustrated in detail, it is clearly understood that the same is by way of illustration and example only and is not to be taken by way of limitation, the spirit and scope of the present invention being limited only by the terms of the appended claims.

While a TMR element is employed as a storage element forming each memory cell in each of the aforementioned embodiments, for example, the present invention is not restricted to this but a storage element other than the TMR element can also be employed so far as the same exhibits ferromagnetic tunneling. An effect similar to those of the aforementioned embodiments can be attained also when employing a storage element, other than the storage element exhibiting ferromagnetic tunneling, exhibiting a magnetoresistance effect (ferromagnetic resistance).

While the signals Φp and Φn for activating the sense amplifier 53 are activated on the basis of the output of the comparator 29 in the aforementioned first embodiment, the present invention is not restricted to this but the sense amplifier 53 may alternatively be activated only with the signal Φn while keeping the signal Φp regularly activated.

What is claimed is:

1. A magnetic memory device comprising:
    a memory cell consisting of a storage element exhibiting ferromagnetic resistance and a transistor connected to said storage element;
    a word line connected to a control terminal of said transistor;
    a first bit line connected to a first end of said storage element through said transistor;
    a reference bit line provided in common for said first bit line and at least one other bit lines;
    an amplifier connected to said bit line and said reference bit line, for reading potential difference caused between said bit line and said reference bit line with said amplifier in data reading; and
    an auxiliary word line connected to a second end of said storage element for pulling down the potential on said second end of said storage element to a ground potential in response to rise timing of a signal toward said word line, for reading said potential difference caused between said bit line and said reference bit line at transient timing for lowering the potential of said auxiliary word line to the ground potential.

2. The magnetic memory device according to claim 1, wherein
    said transient timing for lowering the potential of said auxiliary word line to the ground potential is before the potential of said bit line and the potential of said reference bit line reach the ground potential.

3. The magnetic memory device according to claim 1, wherein
    said amplifier is provided in common for a plurality of said bit lines.

4. The magnetic memory device according to claim 1, wherein
    said storage element exhibiting ferromagnetic resistance includes a first magnetic layer and a second magnetic layer, arranged oppositely to said first magnetic layer through an insulating barrier layer, harder to invert than said first magnetic layer.

5. The magnetic memory device according to claim 1, wherein
    said reference bit line includes a reference memory cell provided every said word line, and
    said reference memory cell includes a first resistive element and a transistor connected to said first resistive element.

6. The magnetic memory device according to claim 5, wherein
    said first resistive element of said reference memory cell has an intermediate resistance value between a resistance value attained when the directions of magnetization of said storage element are parallel and a resistance value attained when the directions of magnetization of said storage element are antiparallel.

7. The magnetic memory device according to claim 6, wherein
    said first resistive element of said reference memory cell includes two second resistive elements, exhibiting ferromagnetic resistance, having said resistance value attained when the directions of magnetization of said storage element are parallel and two third resistive elements, exhibiting ferromagnetic resistance, having said resistance value attained when the directions of magnetization of said storage element are antiparallel, and
    said second resistive elements and said third resistive elements are serially connected respectively while pairs of said serially connected second resistive elements and third resistive elements are connected in parallel with each other.

8. The magnetic memory device according to claim 7, wherein
   said storage element of said memory cell includes a TMR element, and
   said second resistive elements and said third resistive elements of said reference memory cell include TMR elements.

9. The magnetic memory device according to claim 6, wherein
   said first resistive element of said reference memory cell includes a second resistive element, exhibiting ferromagnetic resistance, having a resistance value substantially half said resistance value attained when the directions of magnetization of said storage element are parallel and a third resistive element, exhibiting ferromagnetic resistance, having a resistance value substantially half said resistance value attained when the directions of magnetization of said storage element are antiparallel, and
   said second resistive element and said third resistive element are serially connected with each other.

10. The magnetic memory device according to claim 9, wherein
    said storage element of said memory cell includes a TMR element, and
    said second resistive element and said third resistive element of said reference memory cell include TMR elements.

11. The magnetic memory device according to claim 10, wherein
    said second resistive element and said third resistive element of said reference memory cell have areas twice that of said storage element of said memory cell.

12. The magnetic memory device according to claim 5, wherein
    said first resistive element of said reference memory cell has a resistance value substantially identical to either said resistance value attained when the directions of magnetization of said storage element are parallel of said resistance value attained when the directions of magnetization of said storage element are antiparallel.

13. The magnetic memory device according to claim 12, wherein
    the load capacity of said bit line and the load capacity of said reference bit line are different from each other.

14. The magnetic memory device according to claim 12, wherein
    the gate widths of a pair of transistors forming said amplifier are different from each other.

15. The magnetic memory device according to claim 12, wherein
    said first resistive element of said reference memory cell has a resistance value substantially identical to said resistance value attained when the directions of magnetization of said storage element are parallel.

16. The magnetic memory device according to claim 12, wherein
    said first resistive element of said reference memory cell has a resistance value substantially identical to said resistance value attained when the directions of magnetization of said storage element are antiparallel.

17. The magnetic memory device according to claim 1, wherein
    said storage element of said memory cell includes a TMR element.

18. The magnetic memory device according to claim 1, wherein
    said amplifier includes a cross-coupled latch type voltage sense amplifier.

19. The magnetic memory device according to claim 1, further comprising:
    a dummy bit line provided in common for a plurality of said bit lines, and
    a comparator connected to said dummy bit line through said transistor, wherein
    a dummy storage element having two magnetic layers so set that the directions of magnetization are parallel to each other is connected to said dummy bit line.

* * * * *